(12) United States Patent
Mochida

(10) Patent No.: US 7,014,095 B2
(45) Date of Patent: Mar. 21, 2006

(54) WIRE BONDING METHOD, WIRE BONDING APPARATUS AND WIRE BONDING PROGRAM

(75) Inventor: Toru Mochida, Higashiyamoto (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 338 days.

(21) Appl. No.: 10/647,968

(22) Filed: Aug. 26, 2003

(65) Prior Publication Data

US 2004/0041008 A1    Mar. 4, 2004

(30) Foreign Application Priority Data

Aug. 27, 2002   (JP) .............................. 2002-246119

(51) Int. Cl.
*B23K 31/02* (2006.01)

(52) U.S. Cl. ..................................... 228/180.5; 228/4.5

(58) Field of Classification Search ................. 228/4.5, 228/44.7, 180.5, 212, 1.1, 111, 102, 110.1; 438/214, 612, 613, 615, 617, 618
See application file for complete search history.

(56) References Cited

U.S. PATENT DOCUMENTS

| | | | | |
|---|---|---|---|---|
| 5,967,401 A | * | 10/1999 | Nishiura et al. | 228/180.5 |
| 5,989,995 A | * | 11/1999 | Nishiura et al. | 438/617 |
| 6,176,416 B1 | * | 1/2001 | Tsai et al. | 228/180.5 |
| 6,213,384 B1 | * | 4/2001 | Nishiura et al. | 228/180.5 |
| 6,343,733 B1 | * | 2/2002 | Nishiura et al. | 228/180.5 |
| 6,391,759 B1 | * | 5/2002 | Chao et al. | 438/617 |
| 2002/0137327 A1 | * | 9/2002 | Arakawa | 438/617 |

FOREIGN PATENT DOCUMENTS

| | | |
|---|---|---|
| JP | S63-42135 | 2/1988 |
| JP | H4-318943 | 11/1992 |
| JP | H10-189641 | 7/1998 |

* cited by examiner

*Primary Examiner*—Kevin Kerns
*Assistant Examiner*—Michael Aboagye
(74) *Attorney, Agent, or Firm*—Koda & Androlia

(57) ABSTRACT

Wire bonding being performed by, following the formation of a neck portion on a wire at a first bonding point, raising the capillary from the neck portion while paying out a first specified length of wire, causing the capillary to move toward a second bonding point so that a first kink is formed on the wire, then lowering the capillary so that a second specified length of wire is taken into the capillary, and moving the capillary in the opposite direction from the second bonding point so as to form a second kink, and then raising the capillary, while paying out the wire, until the first kink is positioned at the lower end of the capillary, and finally, with the wire being is held in this state, moving the capillary to the second bonding point, thus completing a wire loop between the first and second bonding points.

1 Claim, 5 Drawing Sheets

WIRE BONDING METHOD, WIRE BONDING APPARATUS AND WIRE BONDING PROGRAM

BACKGROUND OF THE INVENTION

1. Field of the Invention

The present invention relates to a wire bonding method, wire bonding apparatus and wire bonding program, and more particularly relates to a wire bonding method, wire bonding apparatus and wire bonding program that controls the formation of a wire loop between a first bonding point and a second bonding point.

2. Prior Art

A wire bonding apparatus is an apparatus that connects, by a slender metal wire, a first bonding point such as an input-output terminal, etc. on a semiconductor chip such as an LSI, etc. and a second bonding point such as a terminal on the circuit board on which the semiconductor chip is mounted. In this wire bonding, it is desirable that the first bonding point and the second bonding point be connected by a wire loop that has an appropriate shape. If the height of the wire loop is too high, the size of the package, etc. increases, and drooping of the wire tends to occur. If the wire loop is too low, there is a danger that the wire will contact the semiconductor chip or wiring pattern. Accordingly, the operation of wire bonding apparatuses is controlled in order to form an appropriate wire loop.

FIG. 4 shows the procedure of a wire loop formation method of prior art.

In this method, the wire 12 is supplied to a capillary 14 from a wire spool; and during the supply of the wire, an appropriate tension is applied to the wire using air. The capillary 14 is a tubular member; and the wire 12 passes through the hollow portion of this capillary 14 and is held by a wire damper 16 installed above the capillary 14. The wire damper 16 clamps and releases the wire and is moved together with the capillary 14. The objects of bonding 18, 19 are held on a carrying stand (not shown). In order to form a wire loop between the first bonding point 20 of the object of bonding 18 and the second bonding point 21 of the object of bonding 19, the capillary 14 is moved in relative terms with respect to the objects of bonding held on the carrying stand by the processes shown by steps (a) through (g) of FIG. 4, so that necessary kinks necessary for a wire loop are formed in the wire 12.

More specifically, step (a) is the process that connects the wire 12 to the object of bonding 18. In this process, the capillary 14 is lowered with the damper 16 in an open state, so that a ball formed beforehand on the tip end of the wire is bonded to the first bonding point 20.

Next, in steps (b), (c) and (d), the capillary 14 is raised slightly, caused to move horizontally in the opposite direction from the second bonding point, and then raised again. As a result, kinks 22 and 24 are formed in the wire 12. The reason that the kink 22 is formed is that the wire is hardened when the ball is formed on the tip end of the wire, so that the portion of the wire that is located within a certain range from the first bonding point 20 is difficult to bend. Also, the portion of the wire that extends from the first bonding point 20 to the kinks 22 and 24 corresponds to the portion called the "neck portion", where the wire 12 is caused to stand up in the vicinity of the first bonding point when the wire loop is formed.

After the capillary 14 is raised in step (d), the capillary 14 is moved horizontally in the opposite direction from the second bonding point as shown in step (e). As a result, a kink 26 is formed.

Next, in step (f), the capillary 14 is caused to move in the horizontal direction while being raised, until the capillary 14 arrives at a point above the first bonding point 20. As a result, a kink 28 is formed. The amount by which the capillary is raised in this case is set so that the length of the wire that is paid out from the capillary 14 between the first bonding point 20 and the kink 28 corresponds to the length of the wire loop from the first bonding point 20 to the second bonding point 21.

In this step (f), when the capillary 14 is raised to a specified height and the kink 28 is formed, the wire damper 16 clamps the wire 12. In other words, no wire 12 is paid out even if the capillary 14 is moved. Keeping this clamping state, the capillary 14 is moved to the second bonding point 21 of the object of bonding 19 by a circular arc movement or by a lowering movement after a circular arc movement in step (g). In this case, the kink 28 of the wire 12 is positioned at the second bonding point 21, and bonding is performed there.

With the steps described above, a wire loop 30 that has kinks 22, 24 and 26 is formed between the first bonding point 20 and the second bonding point 21. However, since the kinking of the kink 28 is weak, and since the interval between the kink 26 and kink 28 must be long in order to ensure that the wire loop 30 has a certain height, the wire loop 30 tends to droop at the second bonding point 21.

FIG. 5 is a diagram showing the procedure used in another wire loop formation method of prior art. In this method, the wire loop can be endowed with a greater rise in the vicinity of the second bonding point than in the method shown in FIG. 4. In this FIG. 5, the steps from (a) to (c) are processes in which a so-called neck portion is formed in the same manner as in the method of FIG. 4.

After the capillary 14 is moved horizontally in the opposite direction from the second bonding point in step (c) in FIG. 5, the amount by which the capillary 14 is raised in step (d) is greater than in the corresponding step of FIG. 4. Furthermore, as seen from step (e), the amount by which the capillary 14 is moved horizontally in the opposite direction from the second bonding point is also greater than the corresponding step of FIG. 4. Accordingly, the kink 36 that is formed here is positioned further from the first bonding point 20, i.e., closer to the second bonding point, than the corresponding kink 26 in the method of FIG. 4.

Next, in step (f), the capillary 14 is moved in the horizontal direction while being raised, so that the capillary 14 arrives at a point above the first bonding point 20. As a result, a kink 38 is formed. The amount by which the capillary is raised in this case is set so that the length of the wire paid out from the capillary 14 between first bonding point 20 and the kink 38 corresponds to the length of the wire loop from the first bonding point 20 to the second bonding point 21. Since a considerable amount of wire is paid out in step (d), the amount by which the capillary is raised in step (f) is small. Accordingly, the interval between the kink 36 and kink 38 is short, and the shape of the wire in this interval takes a circular arc.

When the capillary 14 is raised to a specified height and the kink 38 is formed in step (f), the wire clamper 16 clamps the wire 12 so that the paying out of the wire is stopped. Keeping this clamping state, the capillary 14 is moved to the second bonding point 21 of the object of bonding 19 by a circular arc movement or by a lowering movement after a circular arc movement as seen in step (g). In this case, the kink 38 of the wire 12 is positioned at the second bonding point 21, and bonding is performed there.

With the steps above, a wire loop 40 that has kinks 22, 24 and 36 is formed between the first bonding point 20 and the second bonding point 21. In this case, the kink 36 is close to the second bonding point 21, and the shape between the kink 36 and kink 38 is a circular arc. Accordingly, the wire loop can be endowed with a greater rise in the vicinity of the second bonding point than in the method shown in FIG. 4.

The above methods are described in, for instance, Japanese Patent Application Laid-Open (Kokai) Nos. S63-42135 (page 2, FIGS. 1 and 2), H04 –318943 (pages 3 –4, FIG. 2) and H10-189641 (pages 2-4, FIGS. 1-7).

However, in the above conventional wire loop formation methods, the kinking of the kink at the second bonding point is week, and the rising portion of the wire loop at the second bonding point tends to droop to some extent. Accordingly, there is a danger that the wire loop may contact the object of bonding. In cases where the second bonding point is a bonding lead on a circuit board, etc., even if the wire loop droops in the vicinity of the second bonding point, the wire loop will merely contact the bonding lead to which the wire is to be bonded, and there would be no problem. On the other hand, in cases where the second bonding point is on the surface of an element such as an LSI, etc. or in cases involving a compact or thin package in which the wire loop is extremely low, there is a danger that drooping of the wire loop in the vicinity of the second bonding point may lead to unexpected short-circuiting.

Furthermore, if drooping of the wire loop results in contact with the object of bonding when the capillary, holding the wire, is being moved to the second bonding point in a circular-arc movement, etc., there is a danger that the shape of the wire loop is deformed by the rebound movement. Furthermore, there is a possibility that the wire loop may fall over in the vicinity of the second bonding point, and there is also a danger that a portion of the wire loop may be pushed into the interior of the hollow portion of the capillary.

In addition, in the prior art methods, when the wire is paid out to the position of the kink (28 in FIG. 4, 38 in FIG. 5) that corresponds to the second bonding point, the capillary is stopped at a specified height, and the paying out of the wire is stopped by clamping the wire so that this portion of the wire is formed into a kink. Accordingly, the total length of the wire and the length of the standing portion in the vicinity of the second bonding point are unstable. The reason for this is that there is friction between the hollow portion of the capillary and the wire, and there is also variation in the air tension that applies an appropriate tension to the wire; as a result, even if the capillary is stopped at a specified height, the amount of wire that is paid out is not constant.

As seen from the above, in wire loop formation methods of the prior art, there is a danger that the wire loop will contact the object of bonding, and the height and shape of the wire loop cannot be stably formed.

SUMMARY OF THE INVENTION

It is, therefore, an object of the present invention is to solve the above-described problems encountered in the prior art and to provide a wire bonding method, wire bonding apparatus and wire bonding program that prevent the wire loop from contacting the object of bonding.

It is another object of the present invention to provide a wire bonding method, wire bonding apparatus and wire bonding program that make it possible to form the shape of the wire loop in a stable manner.

The above objects are accomplished by unique steps of the present invention for a wire bonding method in which a capillary that allows a wire to pass therethrough and holds the wire is moved relative to an object of bonding so that the wire is kinked, and then a first bonding point and a second bonding point are connected by a wire loop; and in the present invention, the method includes:

a neck portion forming process comprising the steps of connecting the wire to the first bonding point, and causing the wire to stand up at the first bonding point, thus forming a neck portion;

a first kink forming process comprising the steps of raising the capillary from the neck portion while paying out an amount of wire that corresponds to a length that is obtained by subtracting a length of the neck portion from a total length of the wire loop, and causing the wire capillary to move toward the second bonding point, thus forming a first kink in the wire at the second bonding point;

a second kink forming process comprising the steps of lowering the capillary so that a portion of the wire that corresponds to a length of the standing portion of the wire at the second bonding point is taken into the capillary, and causing the capillary to move toward an opposite side from the second bonding point, thus forming a second kink at a tip point of a standing portion of the wire in the second bonding position; and a loop forming process comprising the steps of raising the capillary so as to pay out the wire until the first kink is positioned at a tip end of the capillary, while holding the wire in this state, moving the capillary to the second bonding point, and connecting the wire to the second bonding point at the first kink of the wire, thus forming a wire loop.

In the above method, a specified amount of wire is paid out following the formation of the neck portion so that a first kink is formed beforehand at the second bonding point, and a specified amount of wire is then taken into the capillary so that a second kink is formed. Accordingly, the first kink and second kink that regulate the standing portion of the wire at the second bonding point are firmly kinked, so that drooping of the wire loop in the vicinity of the second bonding point and contact with the object of bonding can be prevented. Furthermore, since the positions of the neck portion, first kink and second kink that determine the overall shape of the wire loop are fixed, the shape of the wire loop can be stably formed.

The above objects are further accomplished by a unique structure of the present invention for a wire bonding apparatus that includes:

a capillary that allows a wire to pass therethrough and holds the wire, a carrying stand that holds an object of bonding, a moving mechanism that causes the capillary to move in relative terms with respect to the carrying stand, and a loop formation control means that controls a relative movement of the capillary and a holding of the wire and that forms and connects a wire loop between a first bonding point and a second bonding point of the object of bonding; and in the present invention, the loop formation control means executes:

a neck portion forming routine comprising the steps of connecting the wire to the first bonding point, and causing the wire to stand up at the first bonding point, thus forming a neck portion;

a first kink forming routine comprising the steps of raising the capillary from the neck portion while paying out an amount of wire that corresponds to a length that is obtained by subtracting a length of the neck portion from a total length of the wire loop, and causing the wire capillary to move toward the second bonding point, thus forming a first kink in the wire at the second bonding point;

a second kink forming routine comprising the steps of lowering the capillary so that a portion of the wire that corresponds to a length of the standing portion of the wire at the second bonding point is taken into the capillary, and causing the capillary to move toward an opposite side from the second bonding point, thus forming a second kink at a tip point of a standing portion of the wire in the second bonding position; and a loop forming routine comprising the steps of raising the capillary so as to pay out the wire until the first kink is positioned at a tip end of the capillary, while holding the wire in this state moving the capillary to the second bonding point, and connecting the wire to the second bonding point at the first kink of the wire, thus forming a wire loop.

The above object is further accomplished by a unique structure of the present invention for a wire bonding program that controls the operation of a wire bonding apparatus which includes:

a capillary that allows a wire to pass therethrough and holds the wire, a carrying stand that holds an object of bonding, a moving mechanism that causes the capillary to move in relative terms with respect to the carrying stand, and a loop formation control means that controls a relative movement of the capillary and a holding of the wire and that forms and connects a wire loop between a first bonding point and a second bonding point of the object of bonding; and the program of the present invention renders the loop formation control means to execute:

a neck portion forming routine comprising the steps of connecting the wire to the first bonding point, and causing the wire to stand up at the first bonding point, thus forming a neck portion;

a first kink forming routine comprising the steps of raising the capillary from the neck portion while paying out an amount of wire that corresponds to a length that is obtained by subtracting a length of the neck portion from a total length of the wire loop, and causing the wire capillary to move toward the second bonding point, thus forming a first kink in the wire at the second bonding point;

a second kink forming routine comprising the steps of lowering the capillary so that a portion of the wire that corresponds to a length of the standing portion of the wire at the second bonding point is taken into the capillary, and causing the capillary to move toward an opposite side from the second bonding point, thus forming a second kink at a tip point of a standing portion of the wire in the second bonding position; and a loop forming routine comprising the steps of raising the capillary so as to pay out the wire until the first kink is positioned at a tip end of the capillary, while holding the wire in this state moving the capillary to the second bonding point, and connecting the wire to the second bonding point at the first kink of the wire, thus forming a wire loop.

DETAILED DESCRIPTION OF THE INVENTION

Figure 4:
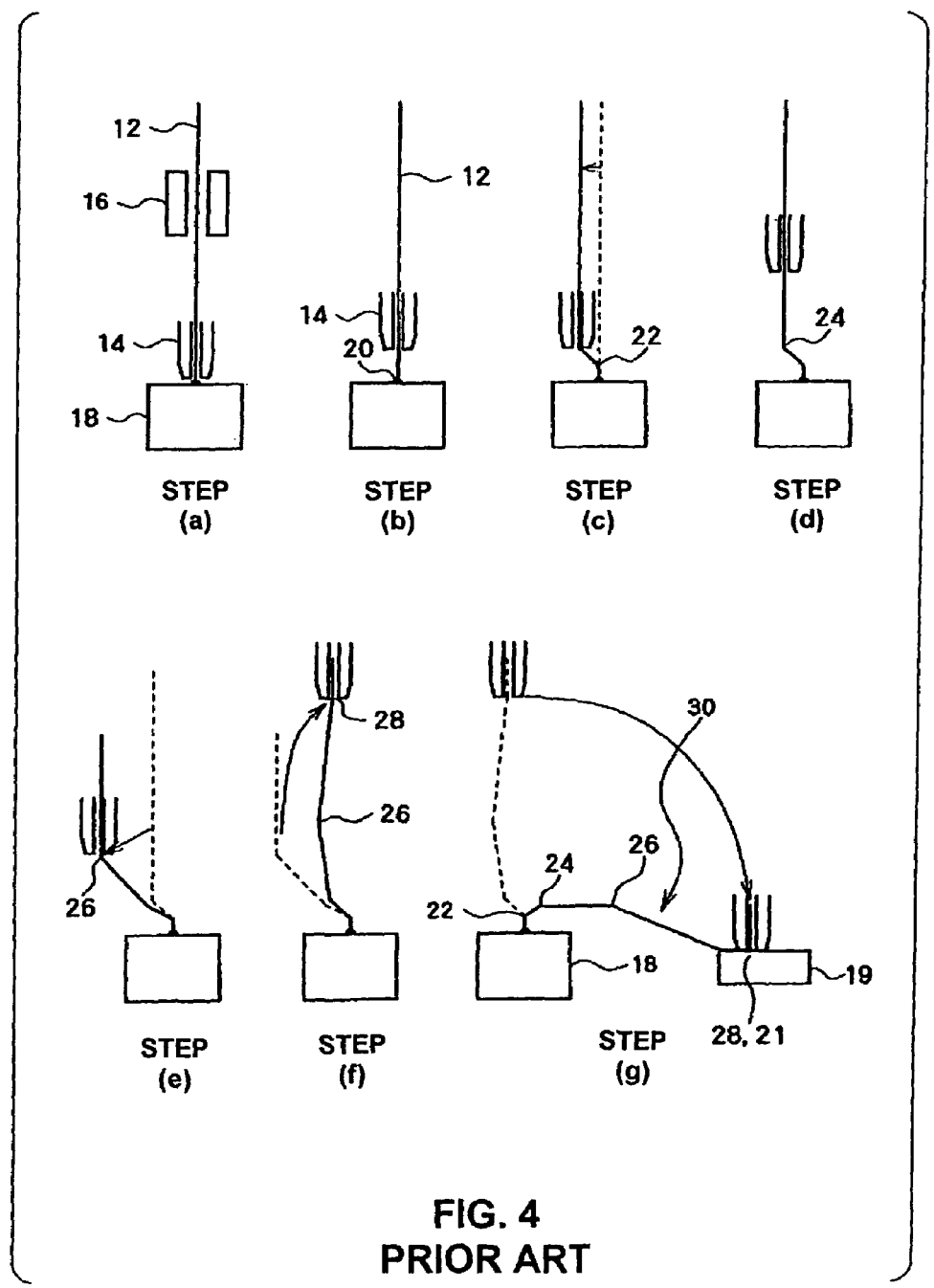
FIG. 4 shows the steps (a) through (g) of a wire loop formation method of the prior art.
Figure 5:
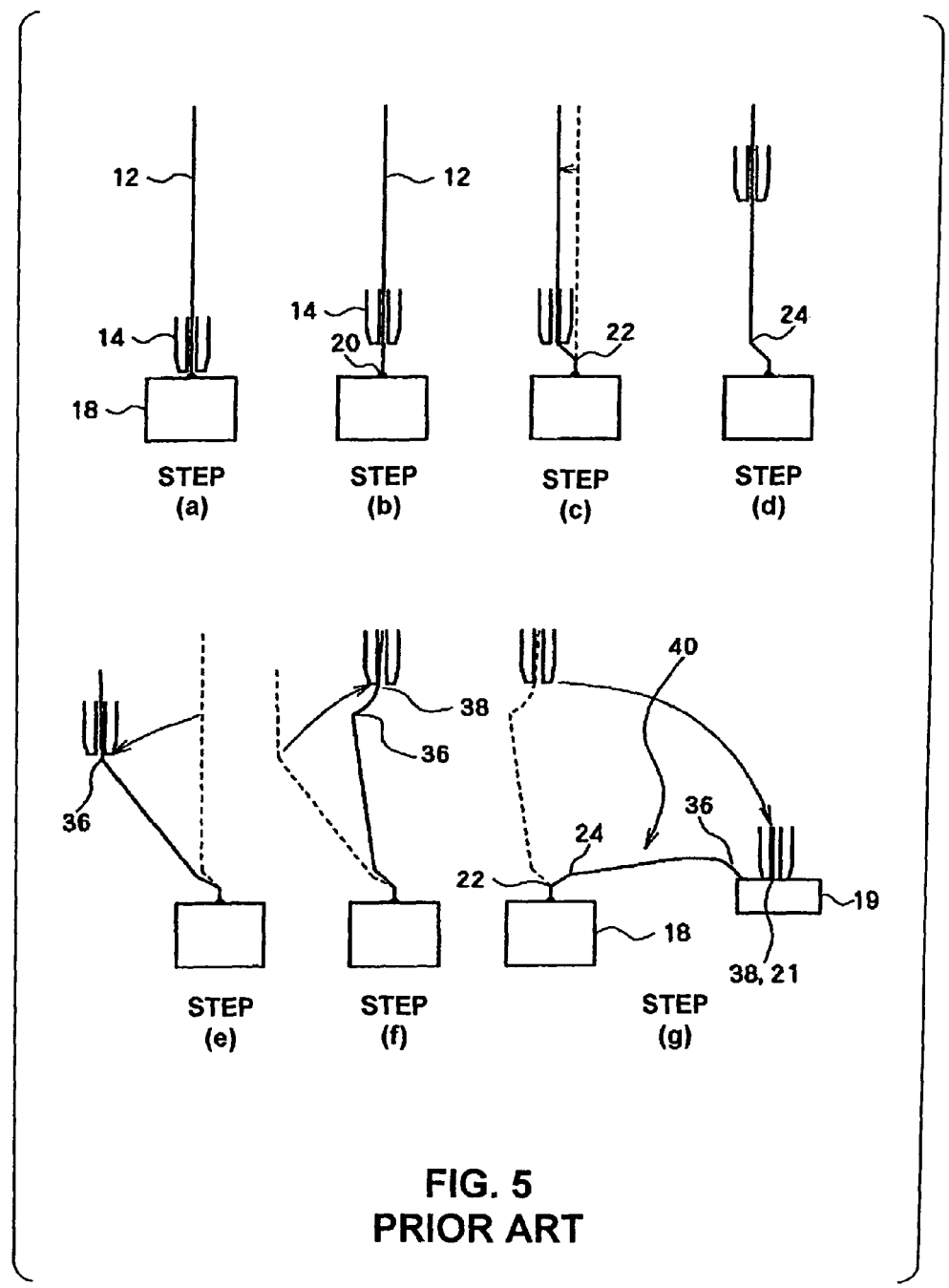
FIG. 5 shows the steps (a) through (g) of another wire loop formation method of the prior art.

Embodiments of the present invention will be described in detail below with reference to the accompanying drawings. In the following description, elements that are the same as in FIGS. 4 and 5 are labeled with the same symbols, and a detailed description of such elements is omitted.

Figure 1:
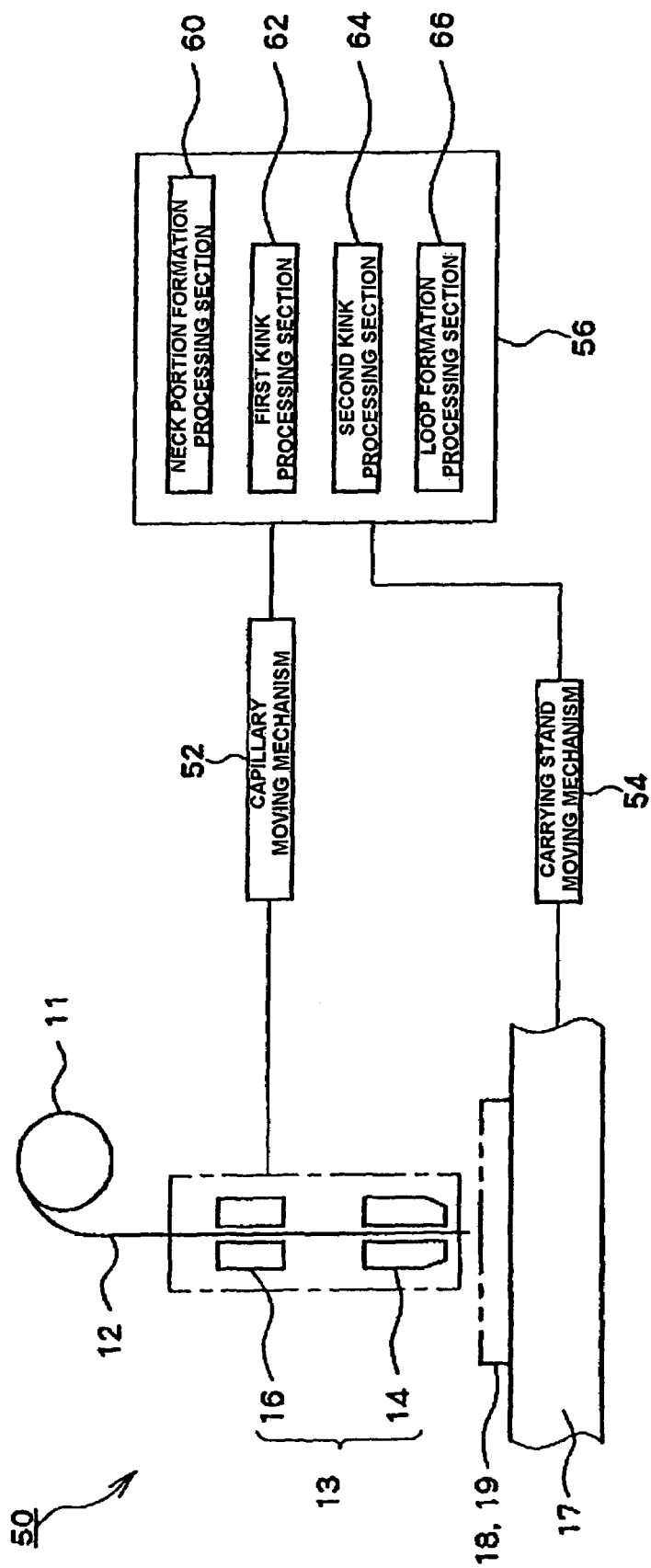
FIG. 1 is a block diagram of the wire bonding apparatus according to the embodiment of the present invention.

In FIG. 1, which is a block diagram of the wire bonding apparatus 50, the wire bonding apparatus 50 comprises a wire spool 11 which is a supply source for the wire 12, a capillary 14 through which the wire 12 passes, a wire damper 16 which clamps and releases the wire 12, a carrying stand 17 which holds the objects of bonding 18 and 19, a capillary moving mechanism 52 which causes the capillary 14 and wire damper 16 to move as a unit, a carrying stand moving mechanism 54 which causes the carrying stand 17 to move, and a control device 56 which controls the operation of these constituent elements.

In the above, the wire 12 is supplied to the capillary 14 from the wire spool 11. In this case, an appropriate degree of tension is applied to the wire by air tension. For example, a gold wire with a diameter of 25 micrometers is used as the wire 12. The capillary 14 is a tubular member; and the wire 12 passes through the hollow portion of this capillary 14 and is held by the wire damper 16. The wire damper 16 is a member that can clamp and release the wire and is moved together with the capillary 14. Since the capillary 14 and wire damper 16 thus act in conjunction to move the wire 12, this block is called, for example, a capillary of a broad sense or capillary section 13.

The carrying stand 17 is an XY table which can move in the horizontal direction; a jig, etc., which holds the objects of bonding can be disposed on the upper surface of this carrying stand 17. For example, a vacuum suction chucking technique can be used to fasten the objects of bonding 18 and 19 to the upper surface of the carrying stand 17.

The capillary moving mechanism 52 is a mechanism that causes the capillary 13 to approach and move away from the carrying stand 17 in relative terms. For example, a servo motor that causes the capillary section 13 to move in the Z direction perpendicular to the carrying stand 17 is used as this mechanism. The carrying stand moving mechanism 54 is a mechanism which causes the carrying stand 17 to move in the horizontal plane relative to the capillary section 13. For example, respective servo motors (one each) for the direction of the X axis and direction of the Y axis (two perpendicular directions within a plane parallel to the upper surface of the carrying stand 17) can be used as this mechanism. It is also possible to use a mechanism in which the capillary moving mechanism 52 and carrying stand moving mechanism 54 are integrated, and the capillary section 13 is moved relative to the carrying stand 17 in three axial directions, i.e., X, Y and Z directions.

The control device 56 includes, in regards to the control of formation of a wire loop, a neck portion formation processing section 60 which controls the formation of the neck portion in which the wire is caused to stand up at the first bonding point of the object of bonding 18, a first kink processing section 62 and a second kink processing section 64 which control the kinking of the standing portion of the wire at the second bonding point of the object of bonding 19, and a loop formation processing section 66 which controls the formation of the wire into a loop form toward the second bonding point. The control device 56 has the functions of controlling the clamping and releasing of the wire in the wire damper 16 and controlling the holding or release of the objects of bonding 18 and 19 on the carrying stand 17.

The control device 56 can be constructed using electronic-circuit hardware or using a computer that executes a control program. For example, such a control program is constructed from a neck portion formation process, a first kink process, a second kink process, and a loop formation process, etc. The control program is contained in the control device 56, and it can be installed in the control device 56 by reading the program from a readable medium by means of a computer that records the control program.

Figure 2:
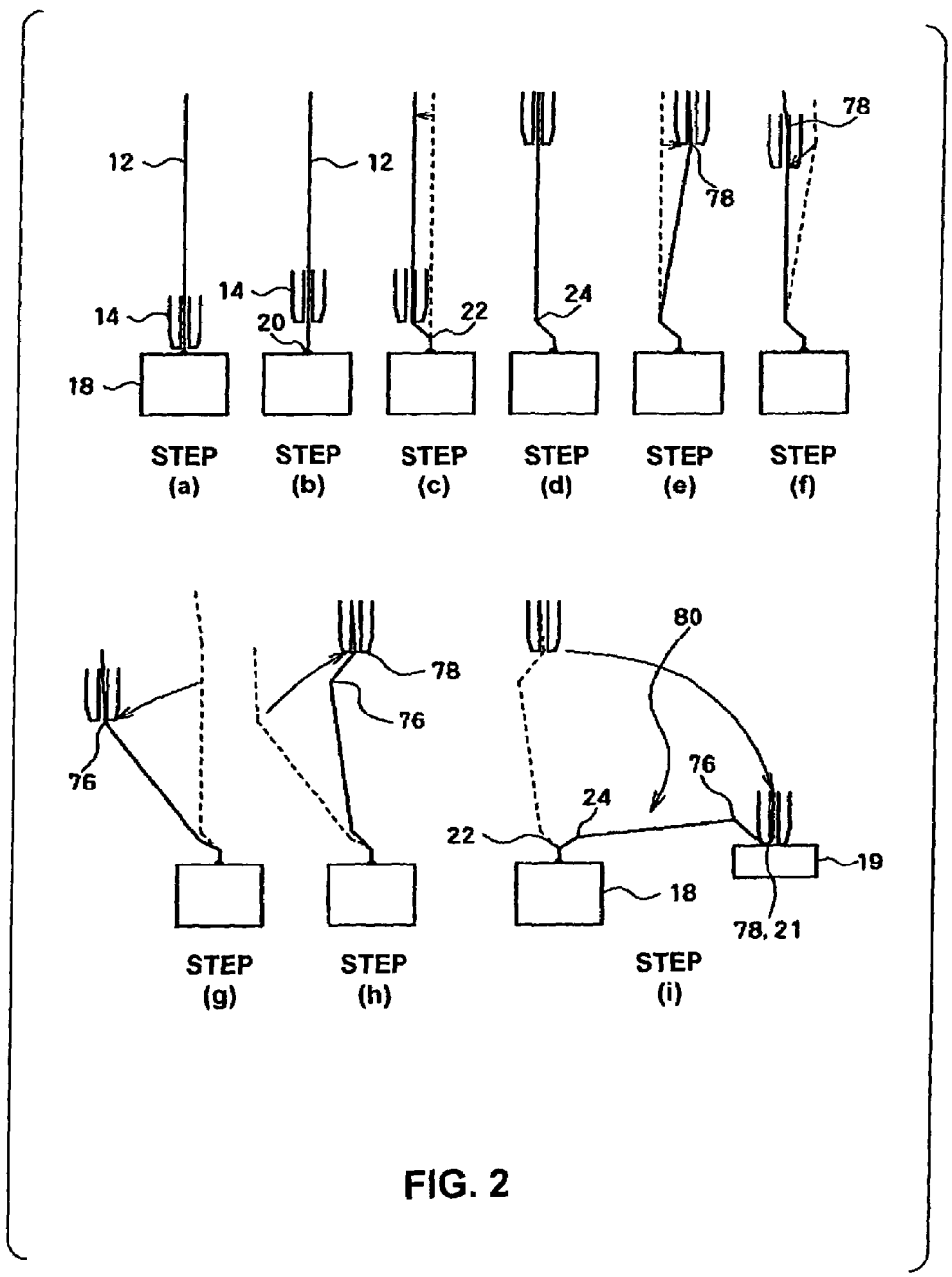
FIG. 2 is a diagram showing the steps (a) through (i) of wire loop formation control in the embodiment of the present invention.

The wire loop formation control in a wire bonding apparatus 50 having the structure above will be described below with reference to FIG. 2. In FIG. 2, the capillary 14 is moved relative to the objects of bonding held on the carrying stand so that the necessary kinks are formed in the wire 12 by the steps (a) through (i) described below in order to form a wire loop between the first bonding point 20 of the object of bonding 18 and the second bonding point 21 of the object of bonding 19.

Steps (a) to (c) form the neck portion in which the wire 12 is caused to stand up at the first bonding point 20 of the first object of bonding 18. In particular, step (a) connects the wire 12 to the object of bonding 18; and in this step, the capillary 14 is lowered with the wire clamper 16 in an open state, and the ball that has been formed beforehand on the tip end of the wire is bonded to the first bonding point 20. Next, as seen from steps (b), (c) and (d) in that order, the capillary 14 is raised slightly, caused to move horizontally in the opposite direction from the second bonding point, and then again raised. As a result, kinks 22 and 24 are formed in the wire 12; and when the wire loop is completed as will be describe later, this portion of the wire constitutes the neck portion, which is the standing portion of the wire 12 at the first bonding point 20.

In step (d), the position of the first kink that is formed in the next step (e) is set on the wire. More specifically, after the kink 24 of the neck portion has been formed in step (c), the capillary 14 is raised by a first specified amount from the kink 24. This first specified amount corresponds to the length that is obtained by subtracting the length of the wire in the neck portion from the total length of the wire loop that is connected by forming a loop extending from the first bonding point 20 to the second bonding point 21. In other words, the position of the wire at the tip end of the capillary 14 at the highest position of the capillary 14 in step (d) corresponds to the position of the second bonding point when the wire loop is formed.

Step (e) a first kink forming process in which the first kink at the second bonding point is formed. In this step, the capillary 14, which has been raised by a specified amount in step (d), is caused to move toward the second bonding point 21; as a result, the wire is firmly kinked at the position of the second bonding point when the wire loop is formed. This kinked portion of the wire will be referred to as the first kink 78.

In next step (f), the position of the second kink that is formed in the following step (g) is set on the wire. In particular, after the first kink 78 has been formed in the wire in step (e), the capillary 14 is moved horizontally while being lowered by a second specified amount, so that the capillary 14 arrives at a point above the first bonding point 20. Accordingly, a length of the wire that corresponds the above-described second specified amount is taken into the capillary 14. This second specified amount is an amount corresponding to the length of the standing portion of the wire at the second bonding position 21. More specifically, the position of the tip end of the capillary 14 at the highest position in step (f) corresponds to the position of the top point of the standing portion of the wire at the second bonding point when the wire loop is formed.

Step (g) is a second kink process that forms a second kink at the top point of the standing portion of the wire at the second bonding point. Here, the capillary 14, which has been lowered by the second specified amount in step (f), is moved in the opposite direction from the second bonding point. The amount of this movement is greater than the amounts of movement in steps (c) and (e). As a result of this movement, the wire is firmly kinked at the position of the top point of the standing portion at the second bonding point when the wire loop is formed. This kinked portion of the wire will be referred to as the second kink 76.

Step (h) is a process that aligns the position of the first kink 78 with the tip end of the capillary 14. After the second kink 76 has been formed in step (g), the capillary 14 is moved in the horizontal direction while being raised so that the capillary 14 arrives at a point above the first bonding point 20. In this movement, the wire is paid out from the capillary; and when the position of the first kink 78 reaches the tip end of the capillary 14, the raising of the capillary 14 is stopped, and the wire is clamped by the wire clamper 16 so that the paying out of the wire is stopped.

In this case, as a result of the movement of the capillary 14 in the horizontal direction, the wire makes an apparent bend at the first kink 78 and second kink 76 as bending points. Thus, the portion of the wire that stands up at the second bonding point when the wire loop is formed is formed as a portion that rises linearly between the first kink 78 and second kink 76, so that drooping of the wire is prevented.

Step (i) is a process that connects the wire to the second bonding point so that a wire loop is formed. In other words, after the first kink 78 has been aligned with the tip end of the capillary 14 in step (h), the capillary is moved to the second bonding point 21 of the object of bonding 19 in this state by a circular arc movement or by a lowering movement after a circular arc movement. In this movement, the kink 78 of the wire 12 is positioned at the second bonding point 21, and bonding is performed there.

As seen from the above, the position of the first kink 78 at (or above) the second bonding point is formed on the wire, and then the second kink 76 which is the top point of the standing portion of the wire at (or above) the second bonding point is formed by way of taking the wire into the capillary for a specified amount; and as a result, the first kink and the second kink are thus formed assuredly at specified positions on the wire. Accordingly, drooping of the wire loop in the vicinity of the second bonding point so that the wire loop contacts the object of bonding is prevented; and the shape of the wire loop can be formed stably.

Other kinks can be formed on demand on the wire at locations other than the first and second kinks in accordance with the desired length of the wire loop and desired height of the objects of bonding, etc.

Figure 3A:
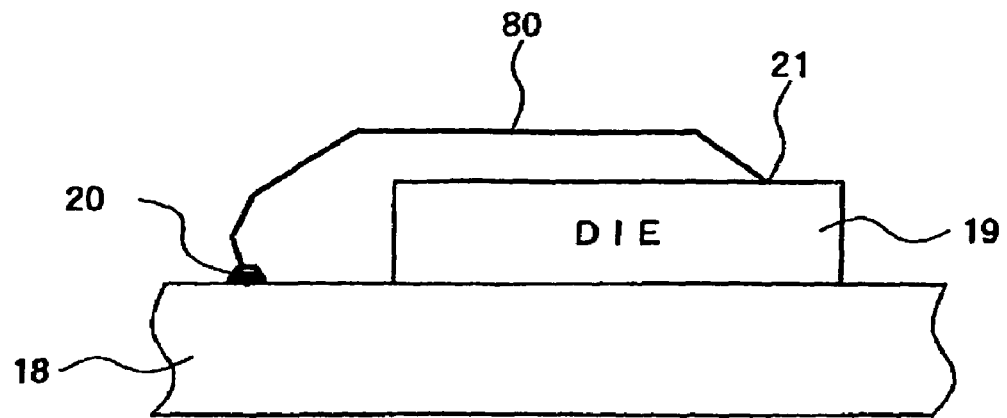
FIGS. 3A and 3B show examples in which wire bonding is performed on objects of bonding using the wire bonding apparatus according to the embodiment of the present invention.
Figure 3B:
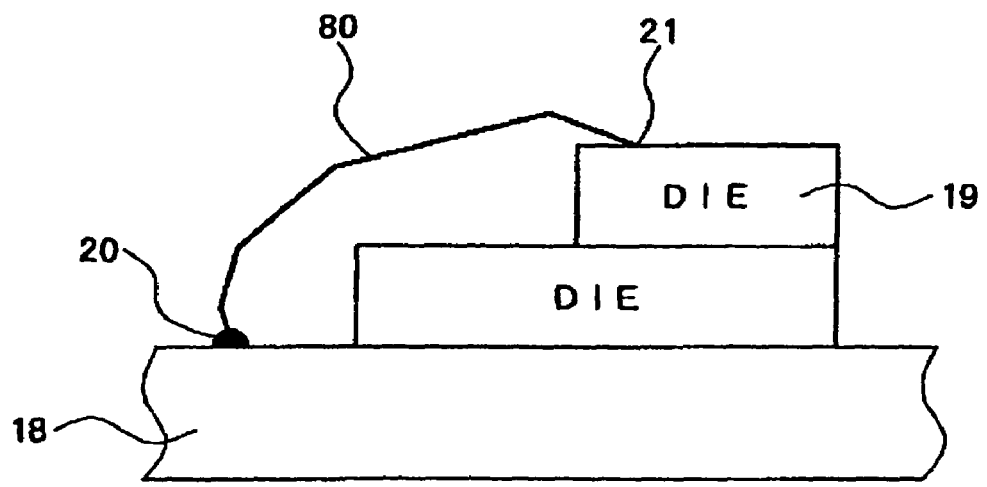

FIGS. 3A and 3B show the examples in which wire bonding is performed on objects of bonding using the wire bonding apparatus of the present embodiment.

In FIG. 3A, the object of bonding 18 on which the first bonding point 20 is disposed is a circuit board, and the object of bonding 19 on which the second bonding point 21 is disposed is an LSI chip (DE). In this case, since there is no drooping of the wire loop 80 in the vicinity of the second bonding point 21, contact between the LSI chip and the wire loop can be prevented. Furthermore, since the shape of the wire loop is stably formed with a low loop height, a more compact and thinner package is possible.

FIG. 3B shows an example in which the object of bonding 18 on which the first bonding point 20 is disposed is a circuit board, and the object of bonding 19 on which the second bonding point 21 is disposed is an upper-layer-side LSI chip (DIE) in an LSI chip that has a two-tier construction known as a so-called "stacked chip". In this case, drooping of the wire loop at the second bonding point 21 would be a greater problem than in the case of FIG. 3A; however, in the present invention, since drooping of the wire loop does not occur in the vicinity of the second bonding point 21, contact between the LSI chip and the wire loop is prevented. Furthermore, since the wire loops of low height can be stably formed, a more compact and thinner package can be obtained while increasing the degree of integration even further.

As seen from the above, according to the wire bonding method, wire bonding apparatus and wire bonding program of the present invention, wire loops can be prevented from contacting the object of bonding. Furthermore, in the wire bonding method, wire bonding apparatus and wire bonding program of the present invention, the shape of wire loops can be stably formed.

What is claimed is:

1. A wire bonding method in which a capillary that holds a wire which passes through said capillary is moved relative to an object of bonding so that said wire is kinked, and a first bonding point and a second bonding point are caused to be connected by a wire loop, said method including:

a neck portion forming process comprising the steps of
connecting said wire to said first bonding point, and
causing said wire to stand up at said first bonding point,
thus forming a neck portion;

a first kink forming process comprising the steps of
raising said capillary from said neck portion while paying out an amount of wire that corresponds to a length that is obtained by subtracting a length of said neck portion from a total length of said wire loop, and
causing said wire capillary to move toward said second bonding point,
thus forming a first kink in said wire at said second bonding point;

a second kink forming process comprising the steps of
lowering said capillary so that a portion of said wire that corresponds to a length of said standing portion of said wire at said second bonding point is taken into said capillary, and
causing said capillary to move toward an opposite side from said second bonding point,
thus forming a second kink at a tip point of a standing portion of said wire in said second bonding position; and a loop forming process comprising the steps of
raising said capillary so as to pay out said wire until said first kink is positioned at a tip end of said capillary,
while holding said wire in this state, moving said capillary to said second bonding point, and
connecting said wire to said second bonding point at said first kink of said wire,
thus forming a wire loop.

* * * * *